(12) United States Patent
Albini et al.

(10) Patent No.: US 9,461,136 B2
(45) Date of Patent: Oct. 4, 2016

(54) MEMORY DEVICE AND METHOD OF FABRICATING THEREOF

(71) Applicant: Micron Technology, Inc., Boise, ID (US)

(72) Inventors: Giulio Albini, Boise, ID (US); Paola Bacciaglia, Bellusco (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/207,035

(22) Filed: Mar. 12, 2014

(65) Prior Publication Data

US 2014/0191307 A1    Jul. 10, 2014

Related U.S. Application Data

(62) Division of application No. 13/143,061, filed as application No. PCT/IB2008/055586 on Dec. 30, 2008, now Pat. No. 8,673,715.

(51) Int. Cl.

| *H01L 29/76* | (2006.01) |
| *H01L 29/49* | (2006.01) |
| *H01L 29/423* | (2006.01) |
| *H01L 21/28* | (2006.01) |
| *H01L 27/105* | (2006.01) |
| *H01L 29/66* | (2006.01) |
| *H01L 29/792* | (2006.01) |

(52) U.S. Cl.
CPC ....... *H01L 29/495* (2013.01); *H01L 21/28282* (2013.01); *H01L 29/4234* (2013.01); *H01L 29/4966* (2013.01); *H01L 21/28044* (2013.01); *H01L 21/28114* (2013.01); *H01L 27/105* (2013.01); *H01L 29/4941* (2013.01); *H01L 29/66833* (2013.01); *H01L 29/792* (2013.01)

(58) Field of Classification Search
CPC .................... H01L 21/28282; H01L 29/4234
USPC ............ 438/257–267; 257/314–321, E21.68, 257/E21.681
See application file for complete search history.

(56) References Cited

U.S. PATENT DOCUMENTS

| 5,509,018 | A  | * | 4/1996 | Niijima et al. ............... 714/710 |
| 2003/0003657 | A1 | | 1/2003 | Kim et al. |
| 2004/0004243 | A1 | * | 1/2004 | Rudeck et al. ............... 257/314 |
| 2005/0112896 | A1 | | 5/2005 | Hamann et al. |
| 2007/0051700 | A1 | | 3/2007 | Lee et al. |
| 2007/0207575 | A1 | | 9/2007 | Taniguchi et al. |
| 2008/0150001 | A1 | * | 6/2008 | Zheng et al. ................. 257/324 |
| 2009/0008701 | A1 | | 1/2009 | Kim et al. |
| 2009/0289297 | A1 | * | 11/2009 | Kim et al. .................... 257/324 |

FOREIGN PATENT DOCUMENTS

WO    WO 01/17021    3/2001

OTHER PUBLICATIONS

International Search Report mailed Jun. 5, 2009 in corresponding International Application No. PCT/IB2008/055586.
Written Opinion mailed Jun. 5, 2009 in corresponding International Application No. PCT/IB2008/055586.

* cited by examiner

*Primary Examiner* — Brook Kebede
(74) *Attorney, Agent, or Firm* — Dicke, Billig & Czaja, PLLC

(57) ABSTRACT

Subject matter disclosed herein relates to a process flow to form a gate structure of a memory device.

20 Claims, 6 Drawing Sheets

MEMORY DEVICE AND METHOD OF FABRICATING THEREOF

REFERENCE TO RELATED APPLICATIONS

This application is a divisional of U.S. patent application Ser. No. 13/143,061, filed Sep. 27, 2011, entitled "MEMORY DEVICE AND METHOD OF FABRICATING THEREOF," which is a national stage application of PCT Patent Application PCT/IB2008/055586, filed Dec. 30, 2008, entitled "MEMORY DEVICE AND METHOD OF FABRICATING THEREOF," each of which is hereby incorporated herein by reference in its entirety.

BACKGROUND

1. Field

Subject matter disclosed herein relates to a process flow to form a gate structure of a memory device.

2. Information

In response to a desire for smaller, higher density memory devices, new materials are being employed in structures of memory devices. For example, a control gate for a memory cell of a flash NAND memory device may comprise a new type of material to provide a satisfactory performance while allowing a scaling of the memory cell to a smaller size. Unfortunately, such use of a new material may introduce new problems during a process flow to form transistors used to control addressing and/or input/output operations for a memory device, for example.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
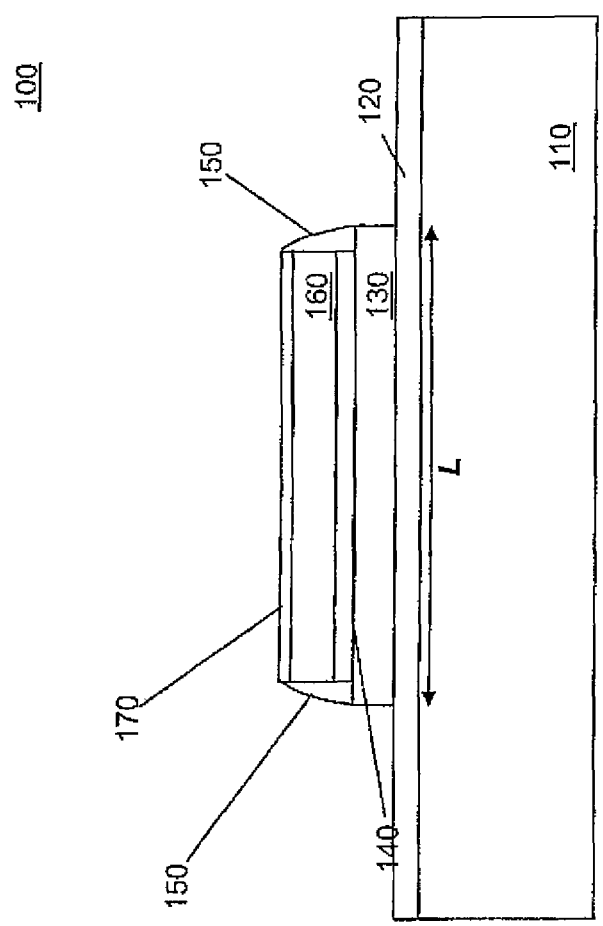
FIG. 1 is a cross-section view of a gate stack of a transistor portion of a memory device, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, materials having relatively high Fermi energy levels, known as high-EF materials, have been most recently included in memory devices to allow such memory devices to be dimensionally scaled down. Such memory devices may include flash NAND, flash NOR, and phase change memories, just to name a few examples. High-EF materials may be particularly reactive to atmospheric elements and/or flow process by-products. Such a relatively high sensitivity to oxidation may result in such materials having an increased reactivity to oxidizing chemicals and high temperature processes. Accordingly, inclusion of high-EF materials in a memory device may present a risk of corruption of its electrical properties. Embodiments of fabrication processes, described below, may be employed to alleviate such a risk.

In a particular embodiment, EF materials may be employed in a gate stack portion of a transistor. Such a gate stack may comprise a control gate layer and a conducting material layer on a semiconductor substrate, for example. The conducting material layer may comprise high-EF materials. In the presence of such materials, a process flow to form such a gate stack may include a single etch to selectively etch the conducting material layer, the control gate layer, and to expose the gate oxide layer above the semiconductor substrate. However, such a single etch may leave high-EF material walls exposed to atmosphere, leading to possible oxidation. Also, such a process flow that includes a single etch may employ a sealing layer that may induce a stress at both gate walls and substrate, adversely affecting electrical performance of the transistor. A flow process, including a second etch, that may avoid such problems is described below.

In an embodiment, EF materials may include, but are not limited to, tungsten, tungsten materials such as WN and $WSi_2$, tantalum, tantalum nitride (TaN), titanium, titanium nitride (TiN), and p-doped polysilicon. In a particular embodiment, TaN may be used in conjunction with tungsten to improve conductivity. Such a combination may be employed as a conducting material layer in a gate stack of a transistor, for example, which is described below. Of course, such EF materials are merely examples, and claimed subject matter is not so limited.

In an embodiment, a process flow to form a gate stack having EF materials may include more than one etch and include deposition of an isolating layer after a first etch. Such a process flow may result in a transistor portion of a memory device 100 shown in FIG. 1, which is a schematic cross-section view of a gate stack, according to an embodiment. Such a gate stack may be formed on a semiconductor substrate 110, which may comprise bulk silicon, for example. Such a gate stack may cover a length L of substrate 110 to result in a particular transistor channel length associated with the gate stack, depending on a particular implementation. A lower portion of a gate stack may include a gate oxide 120 and a control gate 130. Gate oxide 120, oxidized on substrate 110, may comprise a low voltage (LV) and/or high voltage (HV) oxide, for example. A thickness of gate oxide 120 may depend at least in part on whether gate oxide 120 comprises an LV or an HV oxide. Control gate 130 covering gate oxide 120 may comprise n-doped or p-doped polysilicon. An upper portion of the gate stack may include a first metal gate 140, a second metal gate 160, and a hard mask 170. In a particular embodiment, first metal gate 140 and second metal gate 160 may comprise an EF material such as TaN and Tungsten. Although depicted as separate layers, if formed of the same materials, first 140 and second metal gate 160 may be formed to be a single, composite layer. In one particular embodiment, first metal gate 140 may comprise different proportions of TaN and tungsten than that of second metal gate 160, for example. Hard mask 170 may comprise nitride, silicon dioxide, and/or SiON, just to name a few examples. Spacers 150 cover sides of the upper portion of the gate stack. Specifically, spacers 150 may provide protection to first metal gate 140 and second metal gate 160 from atmospheric oxidation, for example. Hard mask 170 may also provide such protection to second metal gate 160. Of course, details of such a gate stack are merely examples, and claimed subject matter is not so limited.

Figure 2:
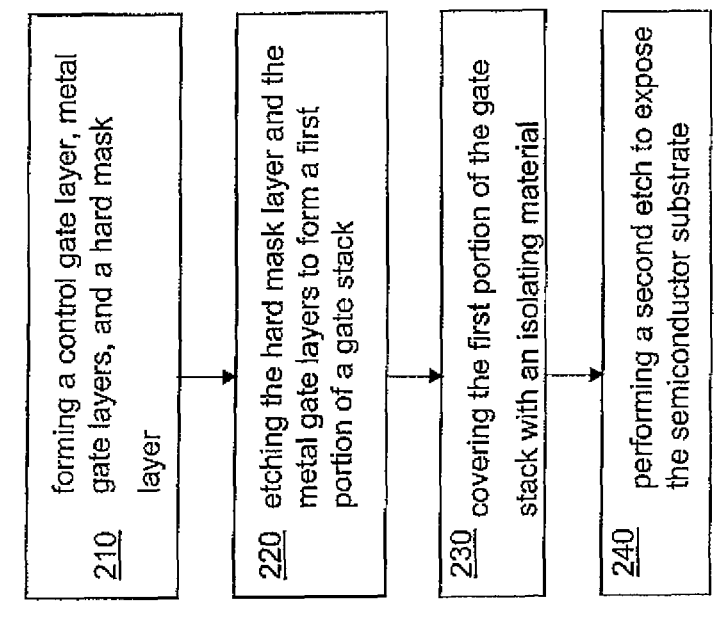
FIG. 2 is a flow diagram of a process to form material to protect a conducting layer of a gate stack, according to an embodiment.
Figure 3:
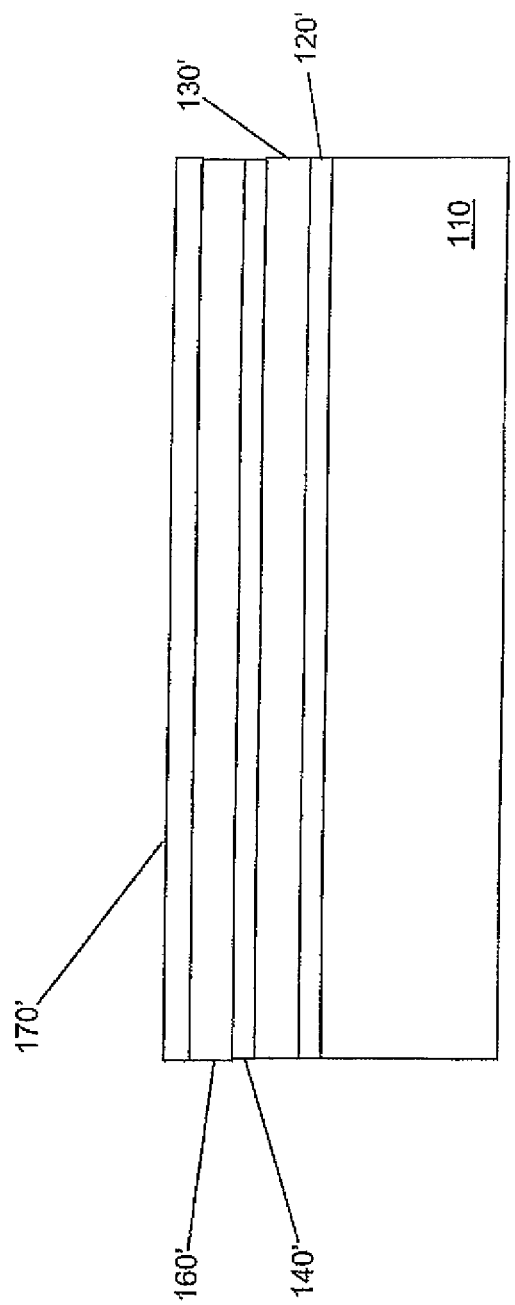
FIG. 3 is a cross-section view of gate stack layers of a transistor portion of a memory device, according to an embodiment.
Figure 4:
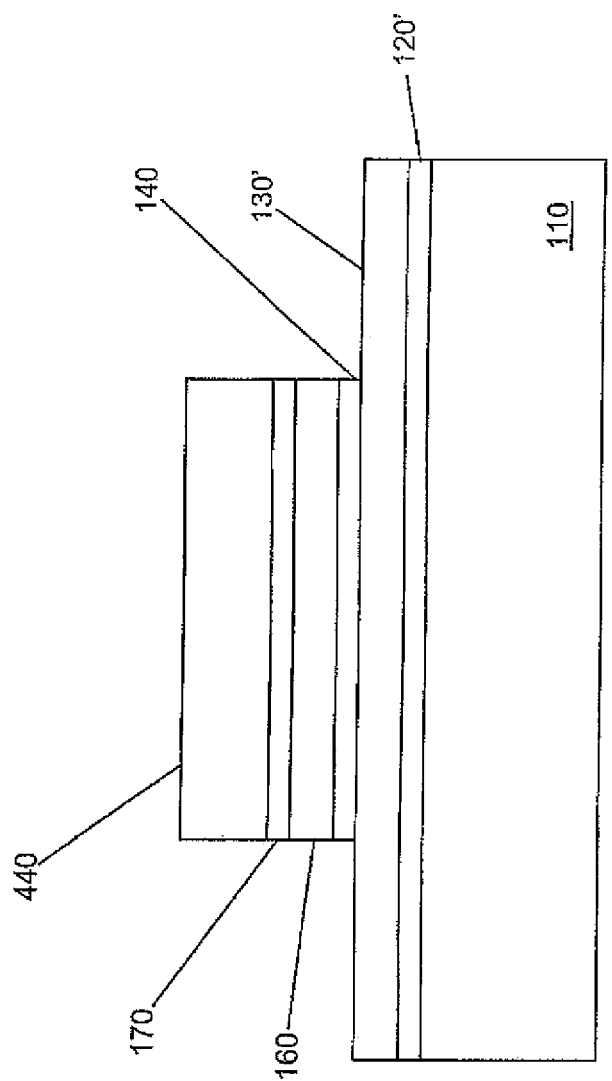
FIG. 4 is a cross-section view of a gate stack of a transistor portion of a memory device including a photoresist mask, according to an embodiment.
Figure 5:
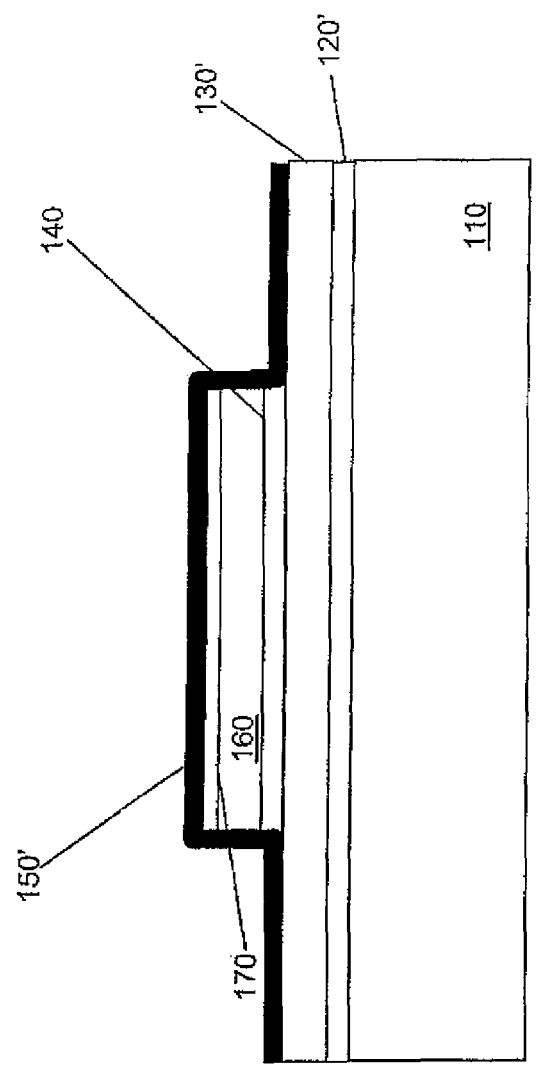
FIG. 5 is a cross-section view of a gate stack of a transistor portion of a memory device including a buffer layer, according to an embodiment.

FIG. 2 is a flow diagram of a process 200 to form material to protect a conducting layer of a gate stack, and FIGS. 3, 4, and 5 are schematic cross-section views of a gate stack of a memory device, according to an embodiment. Such a gate stack may comprise a portion of a transistor used to control addressing and/or input/output operations for a memory device, for example. Using an oxidation or deposition process, for example, a gate oxide layer 120' may be formed by the oxidation of substrate 110. Such an oxidation process may include steam diluted oxidation, steam oxidation, LPRO, ISSG, and/or RTO, for example. Such a deposition process may include chemical vapor deposition (CVD), molecular beam epitaxy (MBE), and atomic layer deposition (ALD), for example. At block 210, a control gate layer 130', first and second metal gates 140' and 160', and a hard mask layer 170' may then be formed to cover gate oxide layer 120', shown in FIG. 3, using a deposition process. Such a deposition process may include, physical vapor deposition (PVD), chemical vapor deposition (CVD), electrochemical deposition (ECD), molecular beam epitaxy (MBE), and atomic layer deposition (ALD), for example. Next, as shown in FIG. 4, a photoresist mask 440 may be formed to cover hard mask layer 170'. Then at block 220, hard mask layer 170' and metal gate layers 160' and 140' may be etched to form a first portion of a gate stack comprising hard mask 170 and metal gates 160 and 140, shown in FIG. 4. During and after this etching process, control gate layer 130' and gate oxide layer 120' may remain on substrate 110 so that substrate 110 is not exposed.

As shown in FIG. 5, the first portion of the gate stack may then be covered with an isolating material 150', as at block 230. Such an isolating material, which may conformally cover the first portion of the gate stack and the substrate structure, may comprise nitride, silicon dioxide, SiON, and/or a composition of such materials, for example. Next, at block 240, a second etch may be performed to expose the semiconductor substrate and/or the gate oxide layer by etching isolating material 150', control gate layer 130', and/or gate oxide layer 120'. Second etch may comprise a non-isotropic dry etch, for example, so that portions of isolating material 150' remain on sides of the first portion of the gate stack to form spacers 150, as shown in FIG. 1. As mentioned above, such spacers may provide protection for first metal gate 140 and second metal gate 160 from atmospheric oxidation or thermal oxidation performed in subsequent process flow steps, for example. A resulting structure may comprise the embodiment shown in FIG. 1. Such spacers may provide protection from atmospheric oxidation while not imposing stress forces on portions of walls of gate 130', such as side walls of first and second metal gates 140 and 160. Accordingly, a memory device comprising such a resulting structure may make advantageous use of high-EF materials while avoiding an increased risk of corruption of the memory device's electrical properties.

Figure 6:
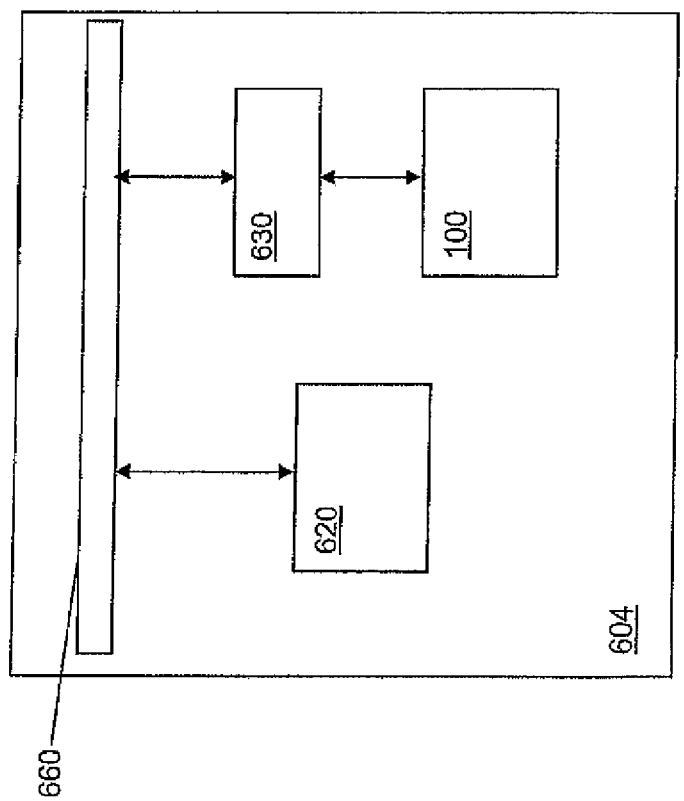
FIG. 6 is a schematic diagram illustrating an exemplary embodiment of a system that may include a memory device.

FIG. 6 is a schematic diagram illustrating an exemplary embodiment of a system 600 that may include one or more memory devices, such as memory device 100 shown in FIG. 1 for example. Such a memory device 100 may include one or more transistors used to control addressing and/or input/output operations for memory device 100, for example. System 600 may include, for example, a computing device 604, such as, e.g., a desktop computer, a laptop computer, a workstation, a server device, or the like. Computing device 604 may include at least one processing unit 620 that is operatively coupled to memory device 100 through a bus 660 and memory controller 630. Processing unit 620 may be representative of one or more circuits configurable to perform at least a portion of a data computing procedure or process, for example. Memory controller 630 may control addressing and/or input/output operations for memory device 100, such as read, write, and/or erase, for example. Of course, such a system is merely an example of an application of a memory device, such as memory device 100, and claimed subject matter is not so limited.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A memory device comprising:
   a gate stack of a transistor disposed on a semiconductor substrate, the gate stack including:
      a hard mask layer;
      a first conductive portion comprising a control gate layer; and
      a second conductive portion comprising a conducting material layer covered by the hard mask layer, wherein the second conductive portion is in contact with the first conductive portion and wherein the second conductive portion has a length in a direction of a channel length of the transistor that is less than a length of the first conductive portion in the direction of the channel length of the transistor; and
   spacers covering sides of the second conductive portion while exposing sides of the first conductive portion, wherein the conducting material layer comprises TaN.

2. The memory device of claim 1, wherein the hard mask layer comprises an oxide.

3. The memory device of claim 1, wherein the conducting material layer further comprises tungsten.

4. The memory device of claim 1, wherein the spacers comprise nitride.

5. The memory device of claim 1, further comprising a high voltage (HV) or low voltage (LV) oxide layer disposed between the semiconductor substrate and the control gate layer.

6. The memory device of claim 1, wherein the control gate layer comprises polysilicon.

7. The memory device of claim 6, wherein the control gate layer comprises n-doped polysilicon or p-doped polysilicon.

8. The memory device of claim 1, wherein the conducting material layer comprises at least two distinct conducting material layers having distinct compositions.

9. The memory device of claim 8, wherein the conducting material layer comprises a first conducting material layer and a second conducting material layer both the first conducting material layer and the second conducting material layer comprising tungsten and TaN, wherein the first conducting material layer comprises a proportion of tungsten to TaN different from that of the second conducting material layer.

10. A system comprising:
- a transistor of a memory device, comprising:
  - a first conductive portion comprising a control gate layer;
  - a second conductive portion comprising TaN over an upper surface of the first conductive portion;
  - a hard mask layer over the second conductive portion; and
  - spacers covering sides of the second conductive portion and covering portions of the upper surface of the first conductive portion while exposing sides of the first conductive portion;
- a memory controller to control the memory device;
- a processing unit to initiate commands to the memory controller for controlling the memory device; and
- a bus to connect the memory controller to the processing unit.

11. The system of claim 10, wherein the hard mask layer comprises at least one of oxide, nitride, and SiON.

12. The system of claim 10, wherein the second conductive portion further comprises tungsten.

13. The system of claim 10, wherein the second conductive portion comprises a high-EF material.

14. The system of claim 10, wherein the first conductive portion comprises polysilicon.

15. The system of claim 10, wherein the spacers further cover sides of the hard mask layer.

16. The system of claim 10, wherein the second conductive portion further comprises titanium.

17. The system of claim 10, wherein the second conductive portion comprises at least two distinct conducting material layers having distinct compositions.

18. The system of claim 10, wherein the transistor further comprises a gate oxide between the first conductive portion and a semiconductor substrate of the transistor.

19. The system of claim 10, wherein the memory device comprises phase change memory.

20. The system of claim 10, wherein the memory device comprises flash memory.

\* \* \* \* \*